(12) United States Patent
Maillard et al.

(10) Patent No.: US 9,281,807 B1
(45) Date of Patent: Mar. 8, 2016

(54) MASTER-SLAVE FLIP-FLOPS AND METHODS OF IMPLEMENTING MASTER-SLAVE FLIP-FLOPS IN AN INTEGRATED CIRCUIT

(71) Applicant: Xilinx, Inc., San Jose, CA (US)

(72) Inventors: Pierre Maillard, San Jose, CA (US); Praful Jain, Los Gatos, CA (US); Michael J. Hart, Palo Alto, CA (US); Sundeep Ram Gopal Agarwal, Hyderabad (IN); Austin H. Lesea, Los Gatos, CA (US); Jun Liu, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/299,196

(22) Filed: Jun. 9, 2014

(51) Int. Cl.
*H03K 3/023* (2006.01)
*H03K 3/037* (2006.01)

(52) U.S. Cl.
CPC ............ *H03K 3/0375* (2013.01); *H03K 3/0372* (2013.01)

(58) Field of Classification Search
CPC ........................... H03K 3/0375; H03K 3/0372
See application file for complete search history.

(56) References Cited

U.S. PATENT DOCUMENTS

| 7,132,870 | B2 * | 11/2006 | Linam et al. .................. 327/202 |
| 7,525,362 | B1 | 4/2009 | Lesea et al. |
| 8,519,743 | B2 * | 8/2013 | Teh et al. ......................... 326/95 |
| 8,547,155 | B2 * | 10/2013 | Holst et al. .................... 327/199 |

* cited by examiner

*Primary Examiner* — Jung Kim
(74) *Attorney, Agent, or Firm* — John J. King; Frederick Hsu

(57) ABSTRACT

A master-slave flip-flop implemented in an integrated circuit comprises a master latch coupled to receive data at an input; and a slave latch coupled to an output of the master latch, wherein the slave latch comprises an SEU-enhanced latch, and the master latch is not enhanced for SEU protection. A method of implementing a master-slave flip-flop in an integrated circuit is also described.

17 Claims, 6 Drawing Sheets

MASTER-SLAVE FLIP-FLOPS AND METHODS OF IMPLEMENTING MASTER-SLAVE FLIP-FLOPS IN AN INTEGRATED CIRCUIT

TECHNICAL FIELD

The various circuits relate generally to integrated circuit devices, and in particular to master-slave flip-flops and methods of implementing master-slave flip-flops in an integrated circuit.

BACKGROUND

Certain applications of programmable logic devices, such as military, aerospace, and high-reliability communications, must be able to operate reliably in environments subjected to various radiation effects caused by energetic heavy ions and subatomic particles striking the silicon. When an ion strikes a circuit, it may cause a glitch in a voltage at a node which may result in an unintentional state change in a data storage node. This is commonly known as soft error, or a single-event effect. Two of the most common single-event effects are single-event upsets (SEUs), which refer to the loss of data in a storage element caused by an ion striking the storage element directly, and single-event transients (SET), which refer to the loss of data caused by a glitch on the clock or other input signals as a result of an ion strike, changing the internal node voltages of the circuit for a short time interval.

D flip-flops (DFFs) are one type of memory element that is subject to upset from cosmic neutrons and terrestrial alpha particles. The failure rate associated with DFFs is known as the Soft Error Rate (SER), and the metric used to quantify the SER of a circuit is known as the Failure In Time (FIT) rate or FIT/Mb. In a typical field programmable gate array (FPGA) design, for example, the clock driving the DFF is most likely in a '0' state when a failure occurs, i.e., indicating that the slave is in latch mode. However, because of modifications to the slave latch to reduce failures, there may be a significant mismatch in the load at the input and output nodes of the master latch when the master latch in in the latch mode, resulting in an increase of the overall DFF FIT rate.

It is desirable to reduce the overall FIT rate of DFFs in an integrated circuit.

SUMMARY

A master-slave flip-flop implemented in an integrated circuit is described. The master-slave flip-flop comprises a master latch coupled to receive data at an input; and a slave latch coupled to an output of the master latch, wherein the slave latch comprises an SEU-enhanced latch, and the master latch is not enhanced for SEU protection.

According to another arrangement, a master-slave flip-flop implemented in an integrated circuit comprises a master latch coupled to receive data at an input; a first inverter coupled to an output of the master latch; a slave latch coupled to an output of the first inverter at a first input; and a second inverter coupled to an output of the slave latch.

A method of implementing a master-slave flip-flop in an integrated circuit is also described. The method comprises receiving data at an input of a master latch; coupling a first inverter to an output of the master latch; coupling a first input of a slave latch to an output of the first inverter; and coupling a second inverter to an output of the slave latch.

Figure 1:
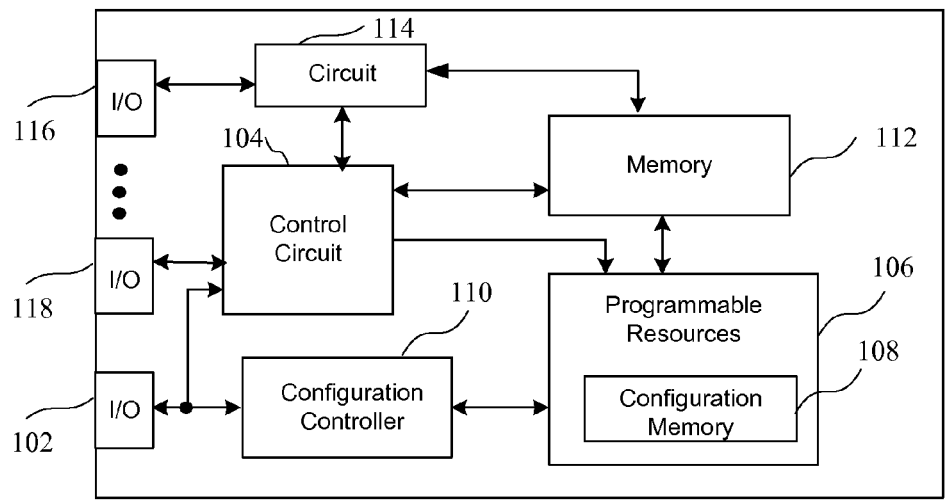
FIG. 1 is a block diagram of an integrated circuit device having programmable circuits that can be used to implement D flip-flops (DFFs)

Other features will be recognized from consideration of the Detailed Description and Claims, which follow.

DETAILED DESCRIPTION

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

The circuit arrangements and methods set forth below improve the Soft Error Rate of D flip-flop cells by optimizing the load and sensitive area distribution at the outputs q and q_b. As a result, the cell neutron and alpha particle FIT rate is minimized and the DFF switching frequency is increased by improving the DFF clock-to-q compared to conventional devices. The circuits and methods significantly reduces the overall DFF FIT rate by minimizing the mismatch between state '0' and '1' FIT rates of the master latch of the DFF.

More particularly, a master-slave flip-flop implemented in an integrated circuit is described. The master-slave flip-flop comprises a master latch coupled to receive data at an input; and a slave latch coupled to receive an output of the master latch, wherein the slave latch comprises an SEU-enhanced latch, and the master latch is not enhanced for SEU protection. An SEU-enhanced latch is a latch that provides greater protection against single-event effects, such as single-event upsets, compared to conventional latches, as will be described in more detail below. The load at the outputs of the Q and Qbar is optimized by advantageously moving an inverter between the master and slave latches of the master-slave flip-flop, and effectively reversing the inputs to the slave latch by coupling the output of the inverter to the first input of the slave latch (which would normally be coupled to receive the output of the master latch), and coupling the input of the master latch to the second input of the slave latch. That is, a master-slave flip-flop implemented in an integrated circuit comprises a master latch coupled to receive data at an input; a first inverter coupled to an output of the master latch; a slave latch coupled to receive an output of the first inverter at a first input; and a second inverter coupled to the output of the slave latch. The circuit is also improved by providing an SEU-enhanced slave latch with a conventional master latch.

Turning first to FIG. 1, a block diagram of an integrated circuit device having circuits that can be used to implement DFFs is shown. In particular, an input/output port 102 is coupled to a control circuit 104 which controls programmable resources 106 having configuration memory 108. Configuration data, which will be described in more detail below in reference to FIGS. 6-8, may be provided to the configuration memory 108 by a configuration controller 110. A separate memory 112, which may be a non-volatile memory for example, may be coupled to the control circuit 104 and the programmable resources 106. Another circuit 114 may be coupled to the control circuit 104 and the memory 112, and may communicate signals external to the integrated circuit device by way of an I/O port 116. Other I/O ports may be coupled to circuits of the integrated circuit device, such as I/O port 118 which is coupled to the control circuit 104 as shown. The master-slave flip-flop may be implemented in any of the circuits of FIG. 1, including the I/O ports.

Figure 2:
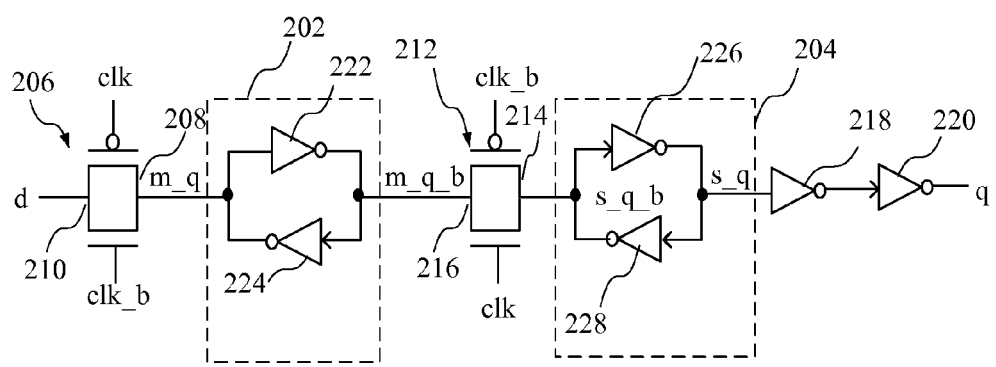
FIG. 2 is a block diagram of a first type of DFF.

Turning now to FIG. 2, a block diagram of a first type of DFF is shown. The DFF of FIG. 2 comprises a master latch 202 coupled to a slave latch 204. The master latch 202 receives an input data signal "d" by way of a pass gate 206, shown here as a CMOS pair of transistors 208 and 210, wherein the data is stored as the master input signal (m_q). An output signal (m_q_b) of the master latch 202 is coupled to an input of the slave latch 204 by way of a pass gate 212, shown here as a CMOS pair of transistors 214 and 216, where the data is stored as the slave input signal (s_q_b). An output signal (s_q) of the slave latch 204 is coupled to a pair of inverters 218 and 220 coupled in series to generate at output signal "q." The master latch 202 comprises a pair of cross-coupled inverters 222 and 224, while the slave latch 204 comprises a pair of cross-coupled inverters 226 and 228.

Figure 3:
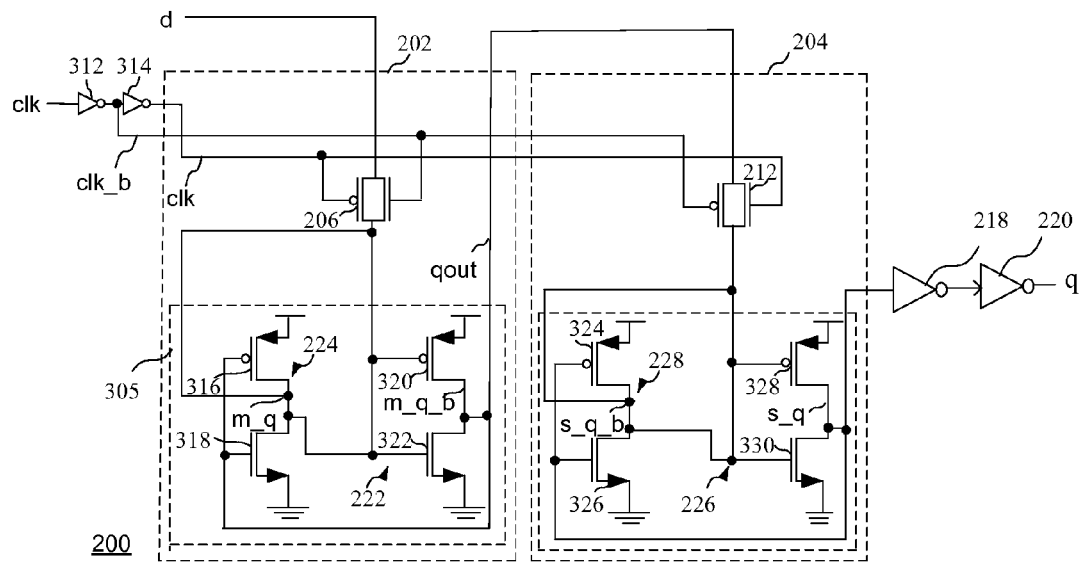
FIG. 3 is a block diagram showing details of the master and slave latches of the DFF of FIG. 2.

Turning now to FIG. 3, a block diagram shows details of the master and slave flip-flops of the DFF of FIG. 2, where each of the master and slave latches are configured as cross-coupled inverters to implement non-hardened latches. As shown in FIG. 3, the data (d) is coupled to a predetermined node of the master latch 202 by way of pass gates which are controlled by clock signals. In particular, the pass gate 206 is coupled to receive the data (d) signal which is coupled to the input of the inverter 222 of the pair 305 of cross-coupled inverters 222 and 224.

The pass gates 206 and 212 are controlled by a clock (clk) signal and an inverted clock signal (clk_b) as shown. The clock signal is coupled to an inverter 312 which generates the inverted clock signal clk_b which is coupled to a second inverter 314 to generate the clk signal. The node at the connection of the drain of transistor 316 and the drain of transistor 318 comprises an inverter node which generates a master input signal m_q. The gate of transistor 318 is controlled by the output m_q_b at an inverter node of inverter 222. The pass gate 206 also comprises a pair of transistors and has an output coupled to the inverter 222 comprising a transistor 320 and a transistor 322, and the data signal coupled to the pass gate 206 is coupled to the gate of the transistor 320 which has a source pulled high and a drain coupled to the drain of the transistor 322, and the gate of transistor 322, which is coupled between the drain of transistor 320 and ground. The inverted master output m_q_b generated at the inverter node at the drains of the transistors 320 and 322 is coupled an input to the slave latch 204.

In particular, the pass gate 212 is coupled to the gates of transistors 328 and 330 of the inverter 226, where the node at the drains of the transistors 328 and 330 generate the slave output signal s_q which is coupled to the gates of transistors 324 and 326. The transistor 328 has a source pulled high and a drain coupled to the drain of the transistor 330 which has a source coupled to ground. The gates of the transistor 228 and 330 are also coupled to receive the signal s_q_b at the inverter node between transistors 324 and 326, where the source of the transistor 324 is pulled high and the drain is coupled to the drain of the transistor 326 which has a source coupled to ground. The inverter node at the drains of the transistors 328 and 330 generates the slave output signal s_q which is coupled to control the gate of transistor 326.

Figure 4:
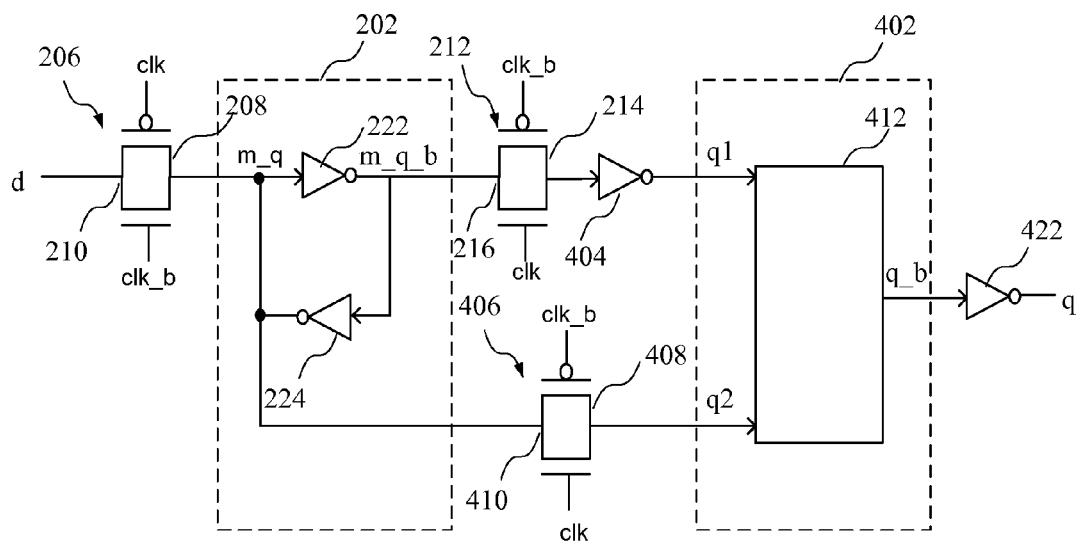
FIG. 4 is a block diagram of a second type of DFF.

Turning now to FIG. 4, a block diagram of a second type of DFF is shown. That is, while the master latch is implemented in the same manner as in FIG. 3, the slave latch is implemented as an SEU-enhanced latch, as will be described in more detail below by way of example in reference to FIG. 5. The slave latch 402 which is coupled to receive an output of the pass gate 212 by way of an inverter 404, and is also coupled to receive the input to the master latch by way of a pass gate 406, shown here as a pair of transistors 408 and 410. As will be described in more detail below, rather than having two inverters (which are necessary to generate the q signal) at the output of the slave latch 204, one of the two inverters (i.e. inverter 404) is placed between the master latch 202 and the slave latch 402, while a second inverter 422 of the two inverters necessary to generate the signal q is placed at the output of the slave latch 402. Further, an SEU-enhanced latch 412 is provided as a slave latch. An example of an SEU-enhanced latch will be described in detail in reference to FIG. 5. The output inverter 422 coupled to the output of the slave latch 402 generates an output signal "q" at an output of the master-slave flip-flop.

Figure 5:
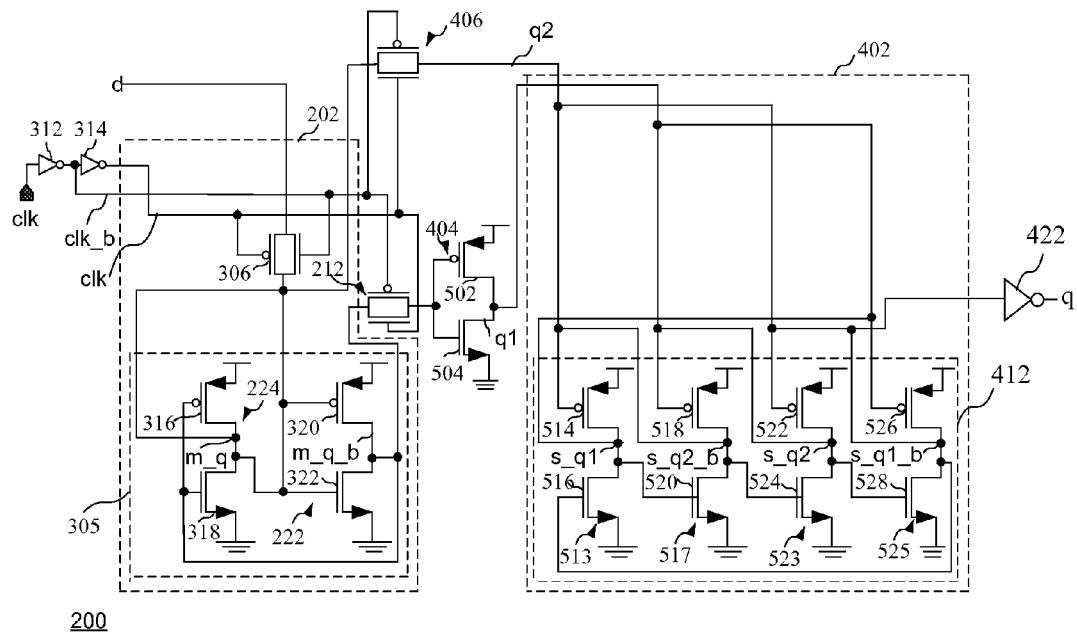
FIG. 5 is a block diagram showing details of the master and slave latches of the DFF of FIG. 4.

Turning now to FIG. 5, a block diagram showing details of the master and slave latches of the DFF of FIG. 4 is shown. The slave latch 402 of the master-slave pair is an SEU-enhanced latch which enables self-correction, while the master latch is implemented as a non-hardened latch as in FIG. 3. That is, slave latch 402 as shown in FIG. 5 is implemented as a dual-interlocked storage cell (DICE). As will be described in more detail below, the logic state of each of the four nodes of the cell is controlled by two adjacent nodes. The arrangement enables restoring the correct logic state at two perturbed nodes on an opposite diagonal. The DICE cell prevents unintended changes in the memory because two nodes on each diagonal do not depend directly on one another, but are controlled by the two nodes of the other diagonal. While a DICE cell is shown by way of example, other SEU-enhanced latches could be implemented. The inverters in the slave section comprise transistors which are selectively connected to the true and complement internal nodes from the master section through pass gates. In particular, the inverted master latch input signal m_q_b at the output of the pass gate 212 is coupled by way of inverter 404 having transistors 502 and 504 to two inputs of the slave latch 402 implemented as a DICE cell. The DICE cell comprises an inverter 513 comprising a gate of a transistor 514 having a source pulled high and a drain coupled to a drain of a transistor 516 which has a source coupled to ground. The node of the inverter 513 at the connection of the drain of transistor 514 and the drain of transistor 516 comprises an inverter node generating a slave signal s_q1. The gate of the transistor 514 is coupled to the output of the pass gate 406, and the gate of transistor 516 is controlled by an inverter node of another path of the slave latch, as will be described below. The DICE cell 402 also comprises an inverter 517 having a transistor 518 and a transistor 520, where the source of the transistor 518 is pulled high and the source of the transistor 520 is coupled to ground. The node at the drains of the transistors 518 and 520 generates an inverted slave output signal s_q2_b. The gate of the transistor 518 is coupled to the output of the inverter 404, and the gate of transistor 520 is coupled to receive the slave output signal s_q1 at the inverter node between transistors 514 and 516.

Two additional stages also receive an output of the master latch. In particular, the output of the pass gate 406 is coupled to a gate of a transistor 522 of an inverter 523 having a source pulled high and a drain coupled to a drain of a transistor 524 which has a source coupled to ground. The node at the connection of the drain of transistor 522 and the drain of transistor 524 comprises an inverter node that generates an output signal s_q2. The gate of transistor 524 is controlled by the inverted slave output signal s_q2_b at the inverter node of the inverter created by transistors 518 and 520. Finally, the output of pass gate 404 is coupled to the gate of the transistor 526 which has a source pulled high and a drain coupled to the drain of the transistor 528 to receive the s_q2 signal. The gate of transistor 528 is coupled to receive the signal at the inverter node between transistors 522 and 524. The node at the drain of the transistor 526 and the source of the transistor 528 is coupled to the gate of the transistor 516, which receives the inverted slave output s_q1_b.

The slave latch 402 of the master-slave pair enables self-correction by coupling output nodes of a stage to a gate of a transistor of another stage. In particular, the node at the drains of transistors 514 and 516 are coupled to the output of the inverter 404, the node at the drains of transistors 518 and 520 are coupled to the output of pass gate 406, the node at the drains of transistors 522 and 524 are coupled to the output of the inverter 404, and the node at the drains of transistors 526 and 528 are coupled to the output of pass gate 406. Accordingly, the circuit of FIG. 5 advantageously provides an improved master-slave flip-flop having an SEU-enhanced slave latch.

By moving an inverter which may be at the output of the slave portion of the master-slave flip-flop, an optimized load distribution between q and q_b nodes of the master latch is provided, which provides an even SEU sensitive area between '0' and '1' states. While inverting the signals d and d_b at inputs of the slave latch by the use of the inverter 404 has no impact on the FF behavior, the change significantly reduces master latch FIT rate and by extension overall FF SER, where the slave FIT rate remains very low. The arrangement of the master-slave flip-flop only having an SEU-enhanced slave latch improves clock-to-q delay by 16%, enabling a higher operating frequency. Because the master-slave flip-flop having an SEU-enhanced slave latch requires additional circuits and therefore takes up additional space, the master-slave flip-flop of FIGS. 4 and 5 can be selectively implemented in certain circuits of an integrated circuit where improved SEU performance is beneficial. For example, the master-slave flip-flops of FIGS. 4 and 5 may be implemented in critical state machines and ECC control circuitry of interface circuitry such a PCIe port, in BRAMs to implement address compare features, in DSPs for select line of critical muxes, and in critical state machines of I/O interfaces, for example.

Figure 6:
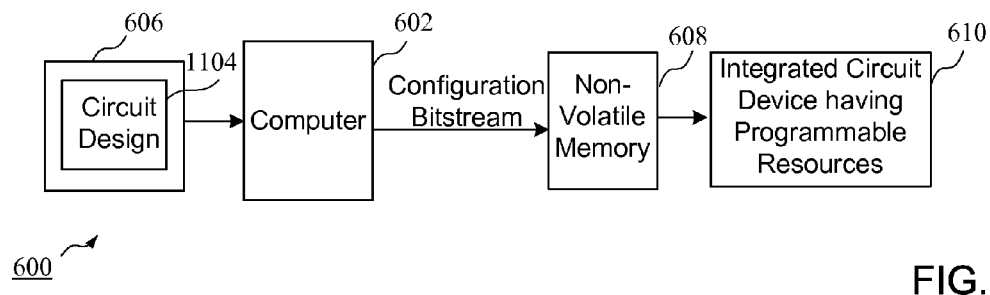
FIG. 6 is a block diagram of system for programming the integrated circuit device of FIG. 8.
Figure 7:
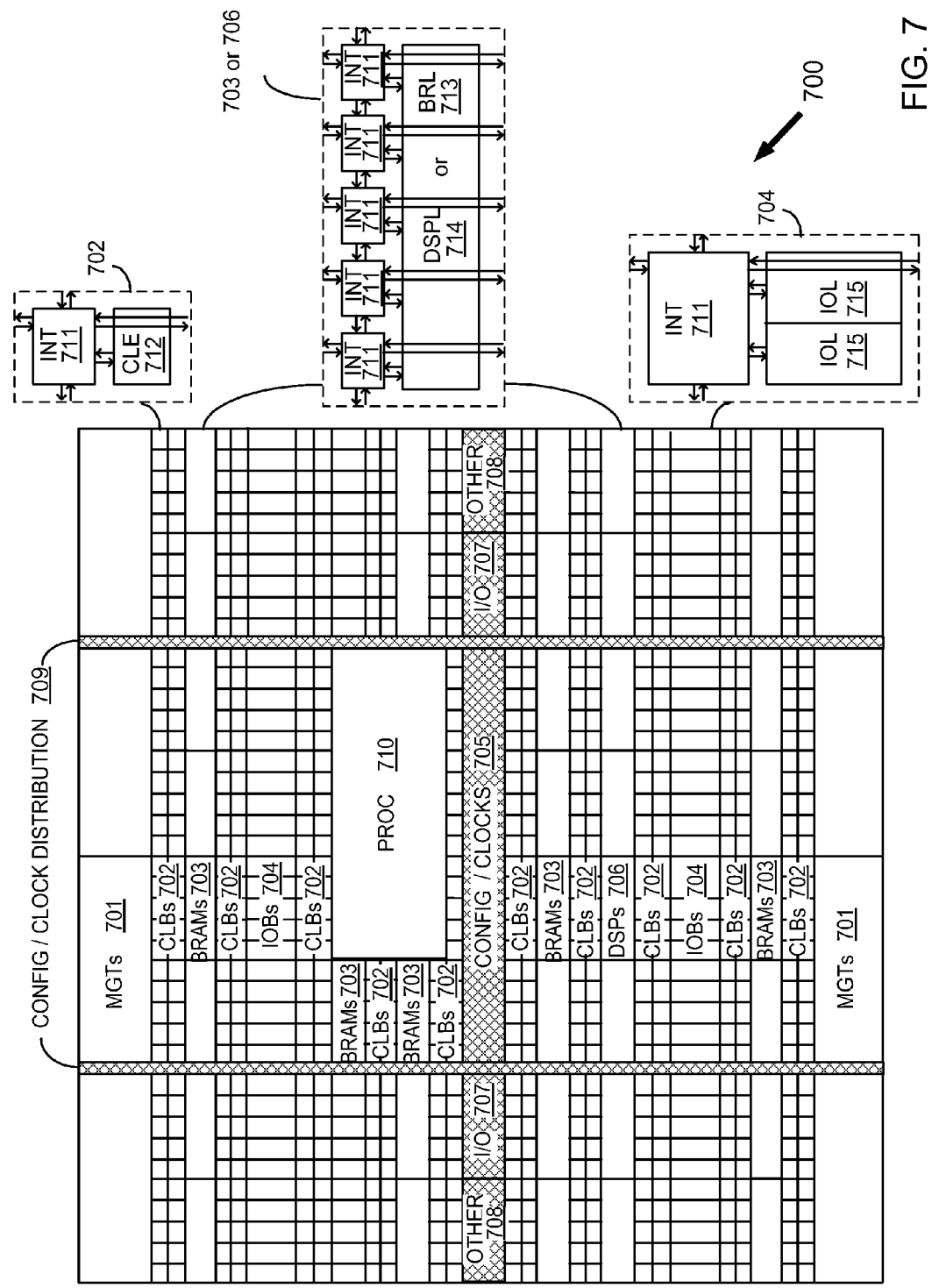
FIG. 7 is a block diagram of an integrated circuit having programmable resources.

Turning now to FIG. 6, a block diagram of system for programming an integrated circuit device, such as the integrated circuit of FIG. 7, is shown. In particular, a computer 602 is coupled to receive a circuit design 604 from a memory 606, and generates a configuration bitstream which is stored in the non-volatile memory 606. As will be described in more detail below, the circuit design may be a high level design, such as a circuit design defined in a hardware description language (HDL). Also, the computer may be configured to run software that generates a configuration bitstream which is stored in the non-volatile memory 608 and provided to an integrated circuit 610 which may be a programmable integrated circuit, such as the integrated circuit described below in FIG. 7. As will be described below, bit of the configuration bitstream are used to configure programmable resources of the integrated circuit.

Turning now to FIG. 7, a block diagram of an integrated circuit having programmable resources is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 7 comprises an FPGA architecture 7900 having a large number of different programmable tiles including multi-gigabit transceivers (MGTs) 701, CLBs 702, random access memory blocks (BRAMs) 703, input/output blocks (IOBs) 704, configuration and clocking logic (CONFIG/CLOCKS) 705, digital signal processing blocks (DSPs) 706, specialized input/output blocks (I/O) 707 (e.g., configuration ports and clock ports), and other programmable logic 708 such as digital clock managers, analog-to-digital converters, system monitoring logic, and so forth. Some FPGAs also include dedicated processor blocks (PROC) 710, which may be used to implement a software application, for example.

In some FPGAs, each programmable tile includes a programmable interconnect element (INT) 711 having standardized connections to and from a corresponding interconnect element in each adjacent tile. Therefore, the programmable interconnect elements taken together implement the programmable interconnect structure for the illustrated FPGA. The programmable interconnect element 711 also includes the connections to and from the programmable logic element within the same tile, as shown by the examples included at the top of FIG. 7.

For example, a CLB 702 may include a configurable logic element (CLE) 712 that may be programmed to implement user logic plus a single programmable interconnect element 711. A BRAM 703 may include a BRAM logic element (BRL) 713 in addition to one or more programmable interconnect elements. The BRAM includes dedicated memory separate from the distributed RAM of a configuration logic block. Typically, the number of interconnect elements included in a tile depends on the height of the tile. In the pictured implementation, a BRAM tile has the same height as five CLBs, but other numbers may also be used. A DSP tile 706 may include a DSP logic element (DSPL) 714 in addition to an appropriate number of programmable interconnect elements. An IOB 704 may include, for example, two instances of an input/output logic element (IOL) 715 in addition to one instance of the programmable interconnect element 711. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured implementation, a columnar area near the center of the die is used for configuration, clock, and other control logic. The config/clock distribution regions 709 extending from this column are used to distribute the clocks and configuration signals across the breadth of the FPGA. Some FPGAs utilizing the architecture illustrated in FIG. 7 include additional logic blocks that disrupt the regular columnar structure making up a large part of the FPGA. The additional logic blocks may be programmable blocks and/or dedicated logic. For example, the processor block PROC 710 shown in FIG. 7 spans several columns of CLBs and BRAMs.

Note that FIG. 7 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 7 are purely exemplary. For example, in an actual FPGA more than one adjacent column of CLBs is typically included wherever the CLBs appear in order to facilitate the efficient implementation of user logic. While the implementation of FIG. 7 relates to an integrated circuit having programmable resources, it should be understood that the circuits and methods for enabling the testing of input/output pads.

Figure 8:
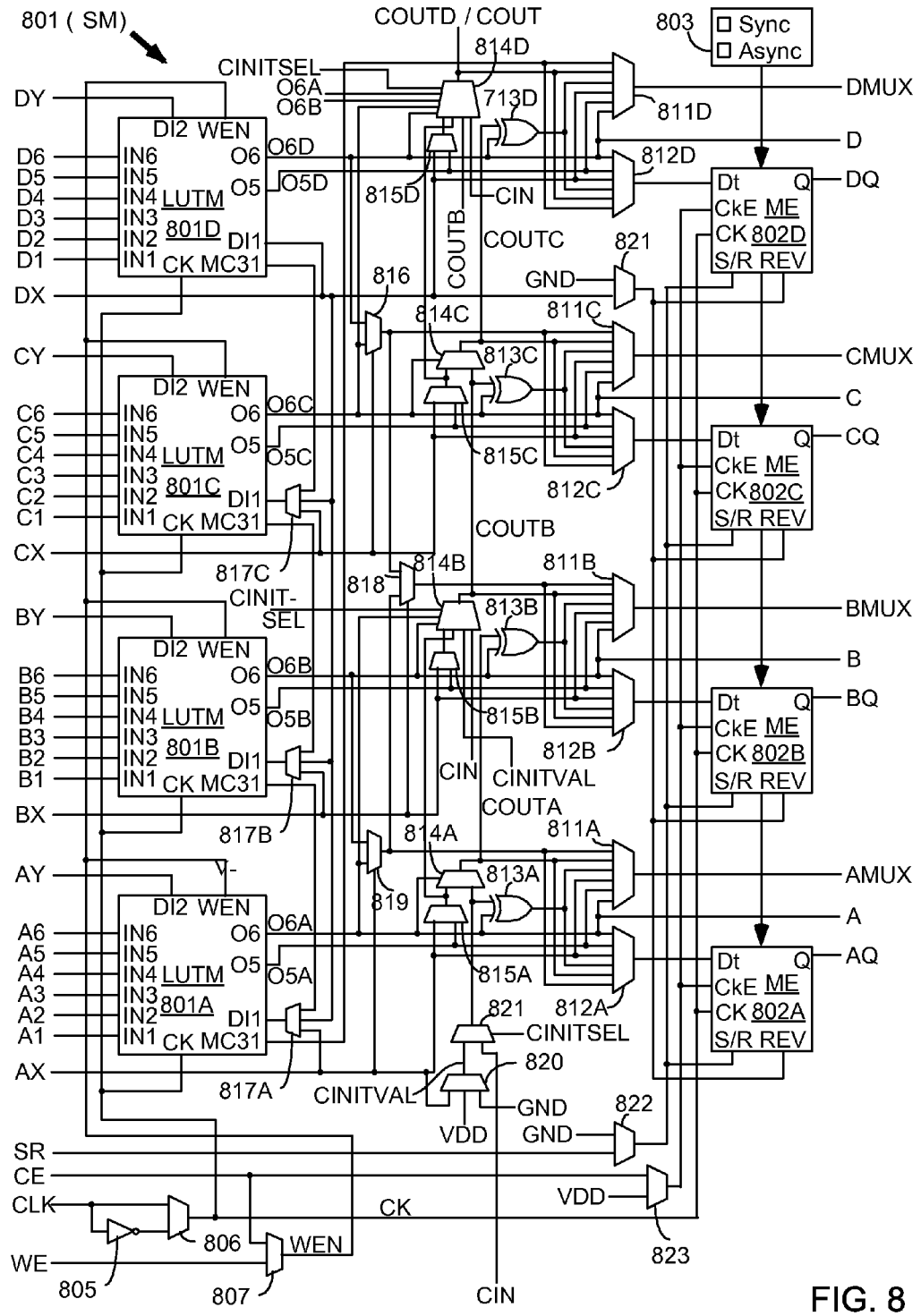
FIG. 8 is a block diagram of a configurable logic element of the integrated circuit of FIG. 7.

Turning now to FIG. 8, a block diagram of a configurable logic element is shown. In particular, FIG. 8 illustrates in simplified form a configurable logic element of a configuration logic block 702 of FIG. 7. In the implementation of FIG. 8, slice M 801 includes four lookup tables (LUTMs) 801A-1001D, each driven by six LUT data input terminals A1-A6, B1-B6, C1-C6, and D1-D6 and each providing two LUT output signals O5 and O6. The O6 output terminals from LUTs 801A-801D drive slice output terminals A-D, respectively. The LUT data input signals are supplied by the FPGA interconnect structure via input multiplexers, which may be implemented by programmable interconnect element 811, and the LUT output signals are also supplied to the interconnect structure. Slice M also includes: output select multiplexers 811A-811D driving output terminals AMUX-DMUX; multiplexers 812A-812D driving the data input terminals of memory elements 802A-802D; combinational multiplexers 816, 818, and 819; bounce multiplexer circuits 822-823; a circuit represented by inverter 805 and multiplexer 806 (which together provide an optional inversion on the input clock path); and carry logic having multiplexers 814A-814D, 815A-815D, 820-821 and exclusive OR gates 813A-813D. All of these elements are coupled together as shown in FIG. 8. Where select inputs are not shown for the multiplexers illustrated in FIG. 8, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 8 for clarity, as well as from other selected figures herein.

In the pictured implementation, each memory element 802A-802D may be programmed to function as a synchronous or asynchronous flip-flop or latch. The selection between synchronous and asynchronous functionality is made for all four memory elements in a slice by programming Sync/Asynch selection circuit 803. When a memory element is programmed so that the S/R (set/reset) input signal provides a set function, the REV input terminal provides the reset function. When the memory element is programmed so that the S/R input signal provides a reset function, the REV input terminal provides the set function. Memory elements 802A-802D are clocked by a clock signal CK, which may be provided by a global clock network or by the interconnect structure, for example. Such programmable memory elements are well known in the art of FPGA design. Each memory element 802A-802D provides a registered output signal AQ-DQ to the interconnect structure. Because each LUT 801A-801D provides two output signals, O5 and O6, the LUT may be configured to function as two 5-input LUTs with five shared input signals (IN1-IN5), or as one 6-input LUT having input signals IN1-IN6.

In the implementation of FIG. 8, each LUTM 801A-801D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 817A-817C for LUTs 801A-801C), or to the two 32-bit RAMs via input terminals DI1 and DI2. RAM write operations in the LUT RAMs are controlled by clock signal CK from multiplexer 1006 and by write enable signal WEN from multiplexer 807, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 801A may also be provided to the general interconnect structure for shift register chaining, via output select multiplexer 811D and CLE output terminal DMUX. Accordingly, the circuits and methods set forth above may be implemented in a device such as the devices of FIGS. 7 and 8, or any other suitable device.

Figure 9:
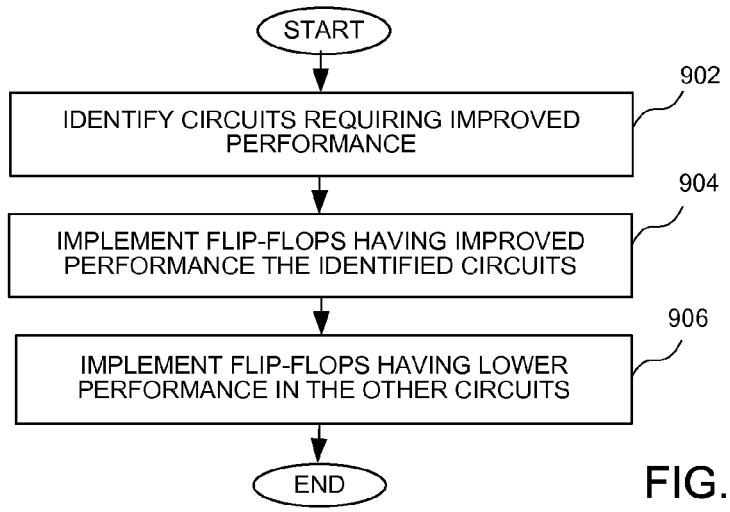
FIG. 9 is a flow chart showing a method of implementing master-slave flip-flops in an integrated circuit.

Turning now to FIG. 9, a flow chart shows a method of implementing master-slave flip-flops in an integrated circuit. In particular, circuits requiring improved performance are identified at a block 902. Flip-flops having improved performance are implemented in the identified circuits at a block 904. Flip-flops having lower performance are implemented in the other circuits at a block 906.

Figure 10:
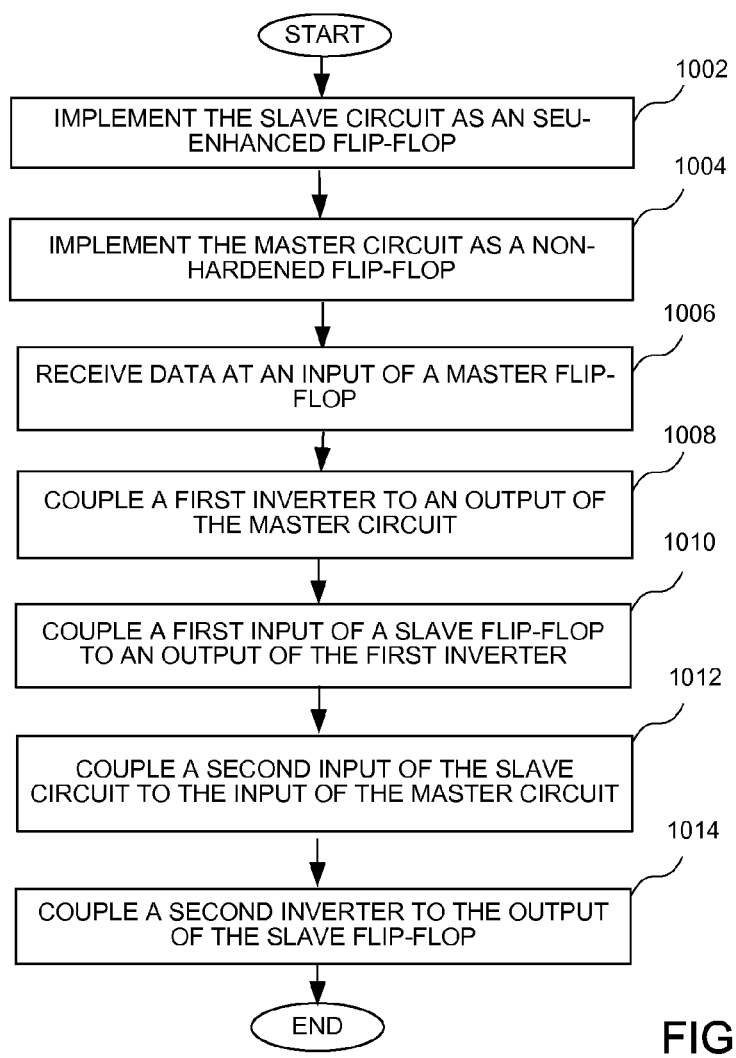
FIG. 10 is a flow chart showing another method of implementing master-slave flip-flops in an integrated circuit.

Turning now to FIG. 10, a flow chart shows another method of implementing master-slave flip-flops in an integrated circuit. The slave latch is implemented as an SEU-enhanced latch at a block 1002. The master latch is implemented as a non-hardened latch at a block 1004. Data is received at an input of a master latch at a block 1006. A first inverter is coupled to an output of the master latch at a block 1008. A first input of a slave latch is coupled to an output of the first inverter at a block 10010. A second input of the slave latch is coupled to the input of the master latch at a block 1012. A second inverter is coupled to the output of the slave latch at a block 1014.

The various elements of the methods of FIGS. 9 and 10 may be implemented using the circuits of FIGS. 1-8 as described, or using some other suitable circuits. While specific elements of the method are described, it should be understood that additional elements of the methods, or additional details related to the elements, could be implemented according to the disclosure of FIGS. 1-8.

It can therefore be appreciated that the new and novel master-slave flip-flops and methods of implementing a master-slave flip-flop in an integrated circuit has been described. It will be appreciated by those skilled in the art that numerous alternatives and equivalents will be seen to exist which incorporate the disclosed invention. For example, the circuits and methods disclosed herein are described as being implemented in a programmable integrated circuit such as an FPGA. However, the disclosed circuits and methods can also be applied to non-programmable integrated circuits. As a result, the invention is not to be limited by the foregoing examples, but only by the following claims.

What is claimed is:

1. A master-slave flip-flop implemented in an integrated circuit, the master-slave flip-flop comprising:
 a master latch coupled to receive data at an input;
 a first inverter coupled to an output of the master latch;
 a slave latch comprising a first slave latch inverter, a second slave latch inverter, a third slave latch inverter and a fourth slave latch inverter, wherein an output of the first inverter is coupled to a first slave latch inverter output of the first slave latch inverter and a third slave latch inverter output of the third slave latch inverter, and the input of the master latch is coupled to a second slave latch inverter output of the second slave latch inverter and a fourth slave latch inverter output of the fourth slave latch inverter; and
 a second inverter coupled to an output of the slave latch at the second slave latch inverter output and the fourth slave latch inverter output.

2. The master-slave flip-flop of claim 1, wherein the slave latch comprises an SEU enhanced a single-event upset enhanced latch.

3. The master-slave flip-flop of claim 2, wherein the master latch comprises a non-hardened latch.

4. The master-slave flip-flop of claim 1, wherein the master-slave flip-flop is selectively implemented in a predetermined type of circuit of the integrated circuit.

5. The master-slave flip-flop of claim 1, wherein the master latch comprises a first pair of cross-coupled inverters.

6. The master-slave flip-flop of claim 1, wherein the slave latch comprises a dual-interlocked storage cell.

7. A method of implementing a master-slave flip-flop in an integrated circuit, the method comprising:
 receiving a master latch input signal at an input of a master latch;
 generating an inverted master latch input signal at an output of the master latch: configuring a first inverter to receive the inverted master latch input signal generated at the output of the master latch;
 generating a slave latch input signal of a slave latch at an output of the first inverter, wherein the slave latch includes a first slave latch inverter, a second slave latch inverter, a third slave latch inverter and a fourth slave latch inverter;
 coupling the slave latch input signal generated at the output of the first inverter to a first slave latch inverter output of the first slave latch inverter and a third slave latch inverter output of the third slave latch inverter;
 coupling the master latch input signal to a second slave latch inverter output of the second slave latch inverter and a fourth slave latch inverter output of the fourth slave latch inverter; and
 coupling a second inverter to an output of the slave latch at the second slave latch inverter output and the fourth slave latch inverter output.

8. The method of claim 7, further comprising implementing the slave latch as a single-event upset enhanced latch.

9. The method of claim 8, further comprising implementing the master latch as a non-hardened latch.

10. The method of claim 7, further comprising implementing the master latch as a first pair of cross-coupled inverters and implementing the slave latch as a dual-interlocked storage cell.

11. The method of claim 7, further comprising further comprising optimizing a load distribution between the output and an inverted output of the master latch.

12. The master-slave flip-flop of claim 1, wherein the first slave latch inverter comprises a first pair of transistors coupled in series, the second slave latch inverter comprises a second pair of transistors coupled in series, the third slave latch inverter comprises a third pair of transistors coupled in series, and the fourth slave latch inverter comprises a fourth pair of transistors coupled in series.

13. The master-slave flip-flop of claim 12, wherein the first slave latch inverter output is configured to control a first transistor of the fourth pair of transistors of the fourth slave latch inverter, the second slave latch inverter output is configured to control a first transistor of third pair of transistors of the third slave latch inverter, the third slave latch inverter output is configured to control a first transistor of second pair of transistors of the second slave latch inverter, and the fourth slave latch inverter output is configured to control a first transistor of first pair of transistors of the first slave latch inverter.

14. The master-slave flip-flop of claim 13, wherein the first slave latch inverter output is configured to control a second transistor of the second pair of transistors of the second slave latch inverter, the second slave latch inverter output is configured to control a second transistor of the third pair of transistors of the third slave latch inverter, the third slave latch inverter output is configured to control a second transistor of the fourth pair of transistors of the fourth slave latch inverter, and the fourth slave latch inverter output is configured to control a second transistor of the first pair of transistors of the first slave latch inverter.

15. The method of claim 7, further comprising implementing the first slave latch inverter having a first pair of transistors coupled in series, the second slave latch inverter having a second pair of transistors coupled in series, the third slave latch inverter having a third pair of transistors coupled in series, and the fourth slave latch inverter having a fourth pair of transistors coupled in series.

16. The method of claim 15, further comprising configuring the first slave latch inverter output to control a first transistor of the fourth pair of transistors of the fourth slave latch inverter, configuring the second slave latch inverter output to control a first transistor of the third pair of transistors of the third slave latch inverter, configuring the third slave latch inverter output to control a first transistor of the second pair of transistors of the second slave latch inverter, and configuring the fourth slave latch inverter output to control a first transistor of the first pair of transistors of the first slave latch inverter.

17. The method of claim 16, further comprising configuring the first slave latch inverter output to control a second transistor of the second pair of transistors of the second slave latch inverter, configuring the second slave latch inverter output to control a second transistor of third pair of transistors of the third slave latch inverter, configuring the third slave latch inverter output to control a second transistor of fourth pair of transistors of the fourth slave latch inverter, and configuring the fourth slave latch inverter output to control a second transistor of first pair of transistors of the first slave latch inverter.

* * * * *